US006795957B2

(12) United States Patent
Lai et al.

(10) Patent No.: US 6,795,957 B2
(45) Date of Patent: Sep. 21, 2004

(54) METHOD OF DESIGNING POWER VIAS IN AN IC LAYOUT

(75) Inventors: Glenn Lai, Milpitas, CA (US); Jong Chang Lee, Macungie, PA (US)

(73) Assignee: Cadence Design Systems, Inc., San Jose, CA (US)

( * ) Notice: Subject to any disclaimer, the term of this patent is extended or adjusted under 35 U.S.C. 154(b) by 100 days.

(21) Appl. No.: 10/323,398

(22) Filed: Dec. 18, 2002

(65) Prior Publication Data

US 2003/0140327 A1 Jul. 24, 2003

Related U.S. Application Data

(60) Provisional application No. 60/342,010, filed on Dec. 18, 2001.

(51) Int. Cl.[7] ................................................ G06F 17/50
(52) U.S. Cl. ............................................ 716/12; 716/8
(58) Field of Search ............................. 716/2, 7, 8, 12, 716/13

(56) References Cited

PUBLICATIONS

Enbody, R.J., et al., "Near–optimal n–layer channel routing", IEEE, 1986, pp. 708–714*

Xiang, Hua et al., "ECO algorithms for removing overlaps between power rails and signal wires", IEEE, 2002, pp. 67–74.*

Dupenlaup, Guy, "A wire routing scheme for double–layer cell arrays", IEEE, 1984, pp. 32–37.*

Bentley, Jon Louis, "Multidimensional binary search trees used for associative searching", IEEE, 1975, pp. 509–517.*

Shenoy, N.V., et al., "An efficient routing database", IEEE, 2002, pp. 590–595.*

Lai, Glenn G., et al., "HV/VH trees: a new spatial data stucture for fast region queries", IEEE, 1993, pp. 43–47.*

* cited by examiner

*Primary Examiner*—Stacy A. Whitmore
(74) *Attorney, Agent, or Firm*—Daniel J. Bedell; Smith-Hill and Bedell

(57) ABSTRACT

An IC layout tool determines areas of an IC layout in which to provide power wire interconnection vias by first querying a "world" HV tree keeping track of power wires and other objects within the IC layout to determine areas of overlap between power wires residing on differing layers of the layout. The layout tool then creates a separate via HV tree identifying positions of "via boxes" residing on areas of each layer of the IC between overlapping power wires. The tool manipulates the data stored in the via HV tree to partition and merge adjacent via boxes residing on each layer as necessary to produce via boxes indicating positions of a set of unobstructed, rectangular areas of each layer of the layout in which vias may be placed to interconnect overlapping power wires. The IC layout tool then places vias in each rectangular area of each layer the via HV tree indicates is being occupied by via boxes.

20 Claims, 8 Drawing Sheets

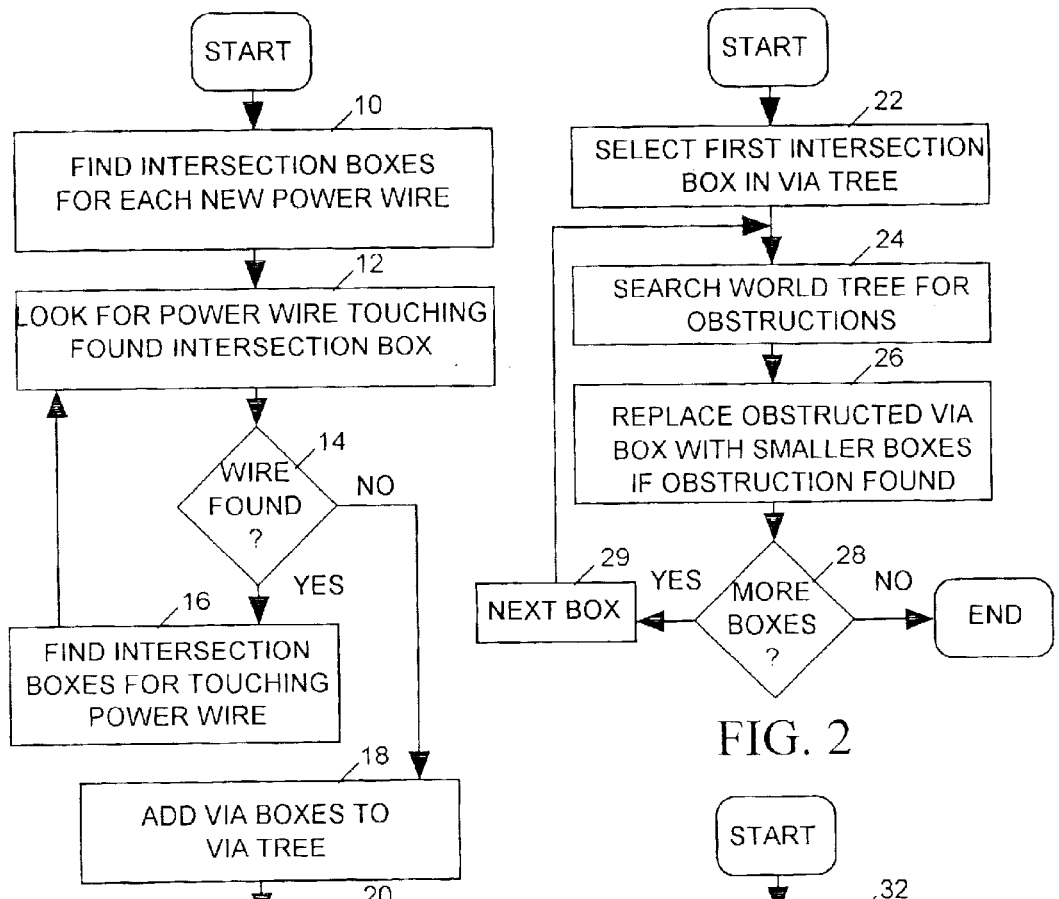
FIG. 1
FIG. 2
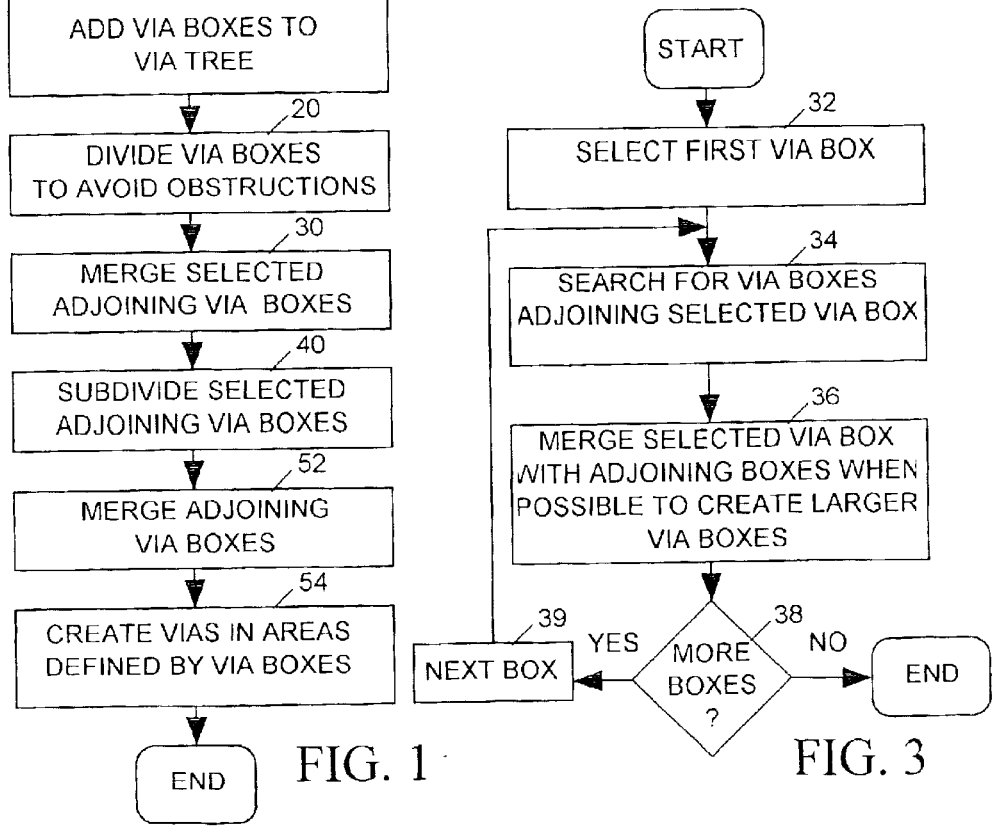
FIG. 3

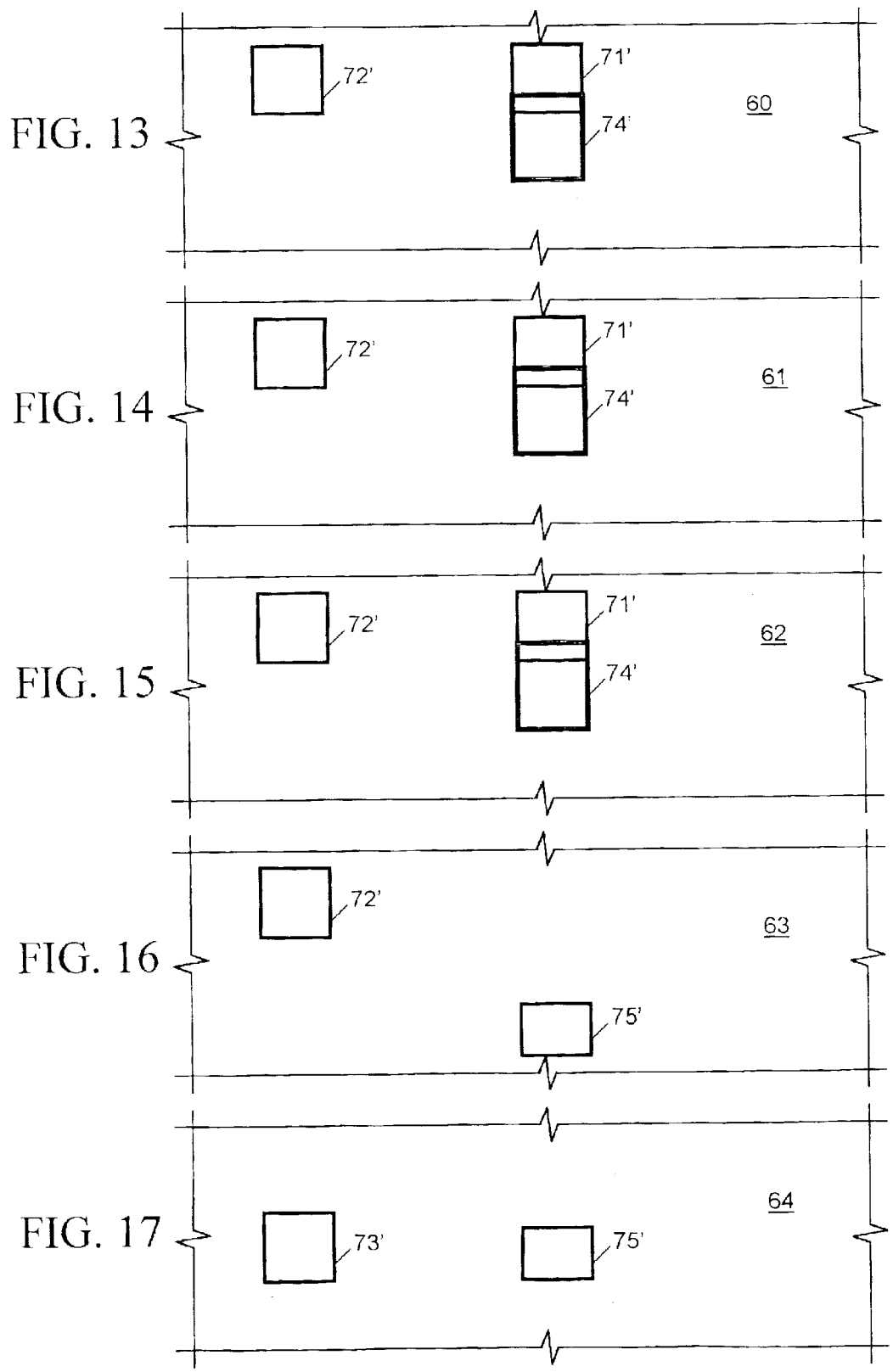

METHOD OF DESIGNING POWER VIAS IN AN IC LAYOUT

CROSS-REFERENCE TO RELATED APPLICATIONS

The present application claims the benefit of the filing date of U.S. Provisional Application No. 60/342,010 filed Dec. 18, 2001.

BACKGROUND OF THE INVENTION

1. Field of the Invention

The present invention relates in general to computer-aided design (CAD) tools for generating integrated circuit (IC) layouts, and particular to a method such a CAD tool can employ to design vias for interconnecting overlapping power wires in an IC layout.

2. Description of Related Art

A power wire is a conductor formed within an IC for conveying a power or ground signal, and power wires formed on more than one layout of an IC may convey the same power or ground signal. To make an IC's power distribution network robust, a CAD tool generating an IC layout should provide conductive vias extending vertically between overlapping power wires carrying the same power or ground signal. Ideally the layout tool should size and position the vias within the planar area of power wire overlap to provide maximum current carrying capacity between the two power wires.

Accordingly, as illustrated in FIG. 27, when a layout tool adds a power wire 120 to a layout that overlaps an existing power wire 122 residing on another layer of the layout, the layout tool forms vias in the rectangular area 124 of vertical overlap. Since vias are typically provided only in a limited range of dimensions, the layout tool sizes and arranges the vias to be formed in area 124 in a way that maximizes the amount of area 124 occupied by vias.

As illustrated in FIG. 28, when the layout tool adds another power wire 126 to the layout adjacent to wire 120, the layout tool finds an area 128 of overlap between new wire 126 and existing wire 122 and therefore designs a via layout in area 128 to link power wires 122 and 126. This progressive, wire-by-wire method of determining where to form vias does not always make the most efficient use of the available space in which to places vias. For example the layout tool would likely be able to make more efficient use of the space occupied by areas 124 and 128 with respect to the current carrying capacity of vias formed in those areas, if it were to treat the two via areas 124 and 128 as a single larger area, and generate the via layout for that larger area as a unified design rather than to design separate via layouts for the two areas 124 and 128.

Therefore what is needed is a computationally efficient method that can be employed by an IC layout tool to group areas of power wire overlap to be filled with vias in a way that enables the layout tool to design via layouts providing maximal current carrying capacity between overlapping power wires.

BRIEF SUMMARY OF THE INVENTION

An IC layout tool employing a method in accordance with the invention determines areas of an IC layout in which to provide power wire interconnection vias by first querying a "world" HV tree that keeps track of positions of power wires and other objects within the IC layout to determine overlapping areas of power wires residing on differing layers of the layout.

The layout tool then creates a separate "via" HV tree identifying positions of a separate set of one or more "via boxes" for each identified area of power wire overlap, wherein each via box of the set spans an area of a separate one of the IC layers residing between the overlapping power wires. The layout tool then modifies the via HV tree to partition each via box spanning an object acting as a via obstruction into a set of smaller via boxes occupying all unobstructed areas of the partitioned via box. The layout tool also merges adjacent via boxes residing on the same IC layers to create larger via boxes. The tool then modifies the IC layout to provide vias in the areas of each layer identified by the via HV tree as being occupied by a via box.

A layout tool can usually design a large via structure (filling a large area) that is capable of handling more current than several smaller via structures it might design to fill several small adjacent areas spanning the same total area as the larger via. Therefore by merging small overlapping or abutting via boxes residing on the same layer into larger via boxes, the method helps to maximize the current carrying capacity of vias the layout tool designs for interconnecting power wires. Using a via HV tree to keep track of spaces in which the layout tool may provide power vias increases the speed of the method because an HV tree can quickly locate areas of objects residing on the same or differing layers overlap or abut one another.

The claims appended to this specification particularly point out and distinctly claim the subject matter of the invention. However those skilled in the art will best understand both the organization and method of operation of what the applicant(s) consider to be the best mode(s) of practicing the invention, together with further advantages and objects of the invention, by reading the remaining portions of the specification in view of the accompanying drawing(s) wherein like reference characters refer to like elements.

BRIEF DESCRIPTION OF THE DRAWINGS

FIGS. 1–4 are flow charts illustrating a method in accordance with the invention for adding power wires and vias to an IC layout.

DETAILED DESCRIPTION OF THE INVENTION

Figure 4:
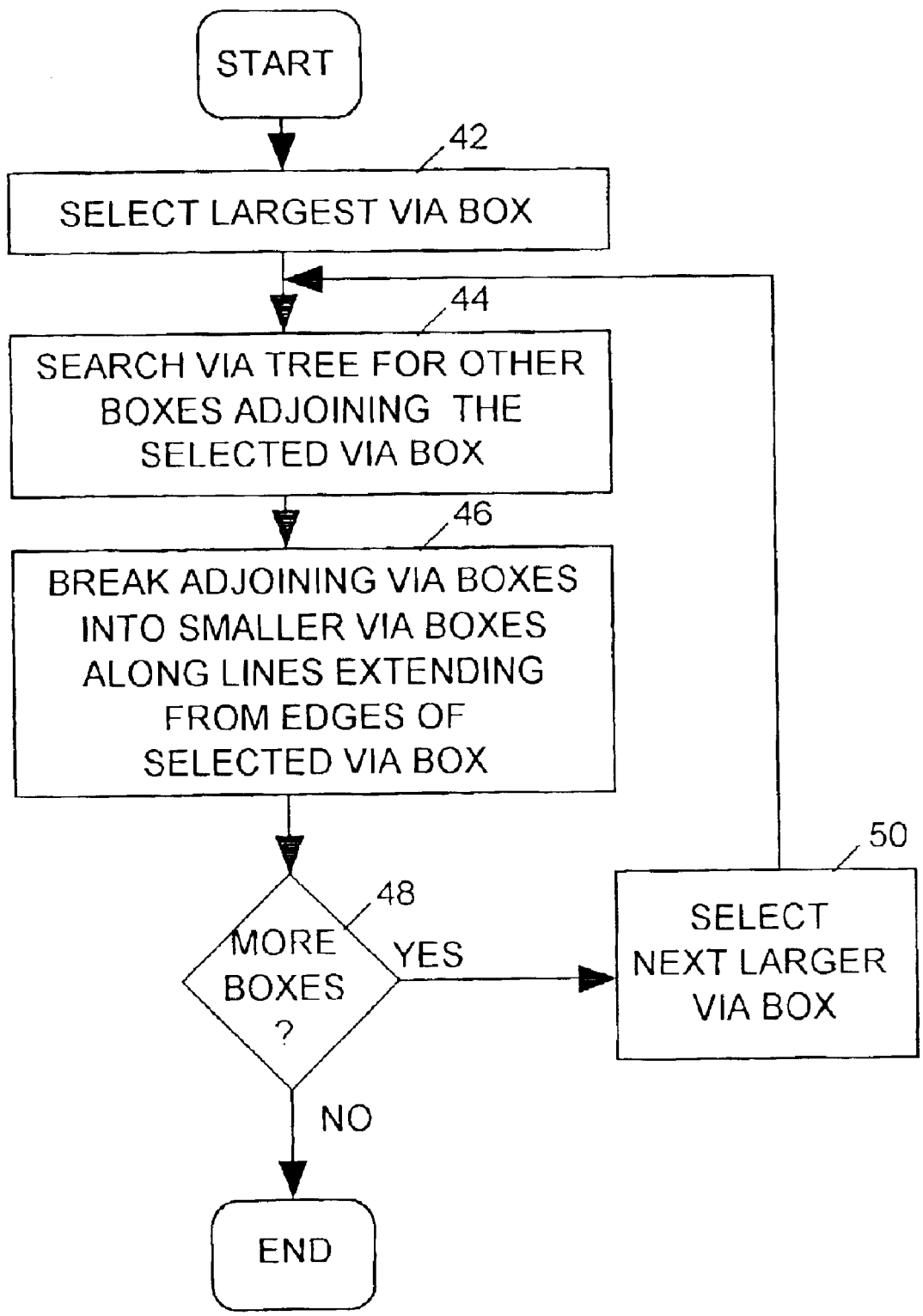

The invention relates to a method that may be implemented by software routines incorporated into otherwise conventional IC layout software residing on computer readable media, including (but not limited to) compact disks, hard disks, floppy disks, read only memory or random access memory, which when read and executed by a conventional computer causes the computer to act as an IC layout placement and routing tool. Although many modes of practicing the invention are possible, this portion of the specification describes in detail only what the applicant(s) consider to be the best modes of practicing the invention.

The method enables the IC layout tool to determine where to form vias within an IC layout for interconnecting overlapping power wires residing of various layers of an integrated circuit (IC) layout. Each power wire of an IC conveys a power or ground signal, and all of power wires within an IC conveying the same power or ground signal are interconnected to form a power distribution network for delivering that power or ground signal to all of the various circuit components that receive it. Since the various power wires of a power distribution network may reside on more than one layer of an IC and may overlap one another, IC designers like to provide vias extending vertically between overlapping areas of power wires of the same power distribution network whenever there are no obstructions (such as other wires or vias) between those overlapping areas. The vias help to improve the robustness of the power distribution network by maximizing the amount of current that can flow between the overlapping power wires.

Given a horizontal, rectangular area of power wire overlap, a conventional IC layout tool can provide one or more vias extending vertically between the power wires within that rectangular area sized and positioned to maximize the current carrying capacity of the vias. The present invention relates to a computationally efficient method that may be employed by an IC layout tool for determining positions and dimensions of overlapping areas of power wires in which the layout tool is to provide vias.

As described below, a method in accordance with the invention makes use of a database system known as an "HV tree" for keeping track of the positions of various objects residing in one or more parallel planes. An HV tree can quickly respond to queries asking for positions and dimensions of any of the objects that at least partially reside in some specified region of the two-dimensional space. In the context of the two-dimensional space represented by each signal routing layer of an IC, such objects can include wires and vias that reside on or pass though the layer. The use of HV tree data structures to keep track of object positions within an IC layout is described in the article entitled "HV/VH Trees: A New Spatial Data Structure for Fast Region Queries", by Glenn G. Lai, Don Fussell, and D. F. Wong, published June 1993 by the 30th ACM/IEEE Design Automation Conference, incorporated herein by reference.

FIGS. 1–4 illustrates in flow chart form an exemplary best mode embodiment of the method in accordance with the invention. A layout tool employing the method maintains a "world" HV tree that keeps track of the position of all objects (e.g. wires and vias) on each signal distribution layer of an IC layout. When one or more new power wires are added to a power distribution network, the layout tool initially (step 10) queries the world HV tree, asking it to return data indicating the horizontal position and dimensions of each "intersection box" defined by an area of intersection between each new power wire and any other power wires of the same power distribution network. Power wires are considered to "intersect" if they reside on different levels of the IC layout, and at least a portion of one power wire overlaps the other when viewed from above. Each normally rectangular intersection box therefore represents an area of overlap between two power wires in which one or more vias could be provided to interconnect the two power wires, on condition that there are no obstructions between the power wires.

Figure 5:
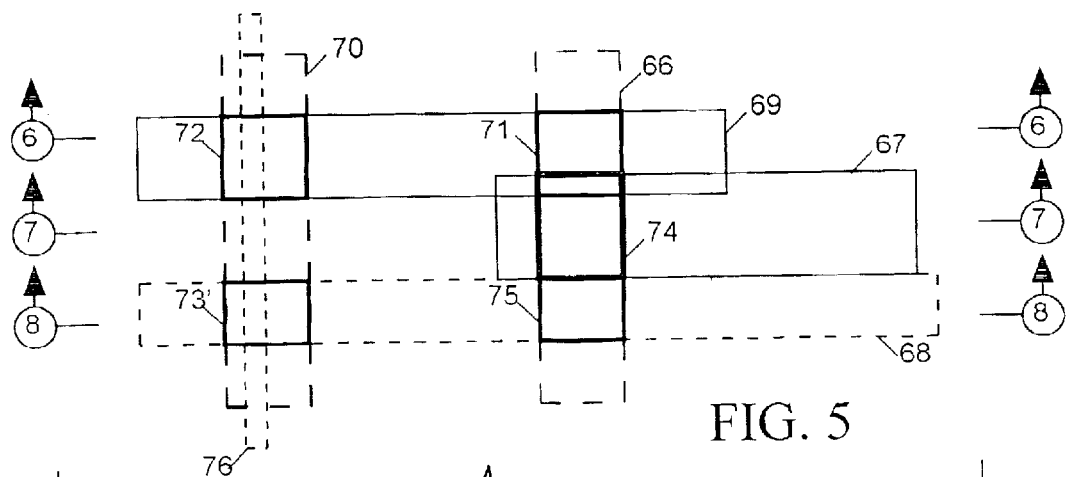
FIG. 5 is a plan view of wires residing on signal distribution layer of a portion an example IC layout as described by a world HV tree in accordance with the invention.
Figure 6:
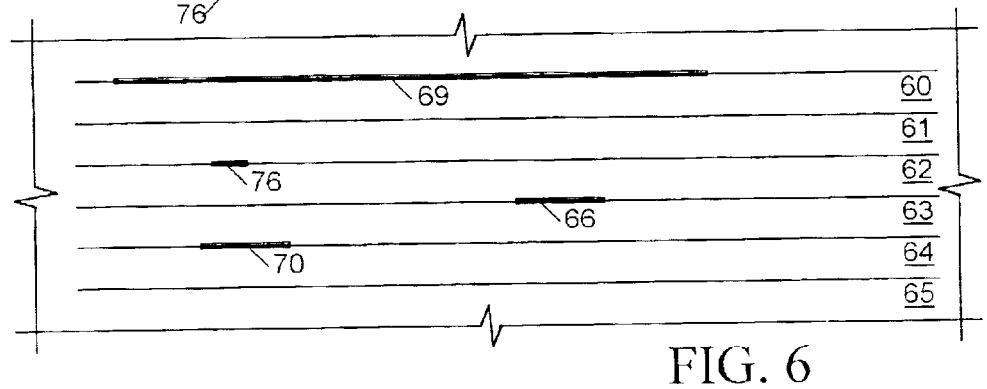
FIGS. 6–8 are sectional elevation views of the IC layout of FIG. 3.
Figure 7:
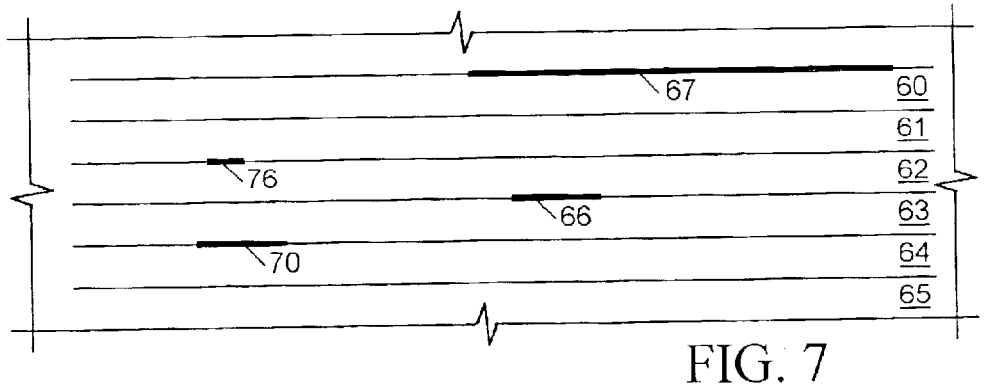
Figure 8:
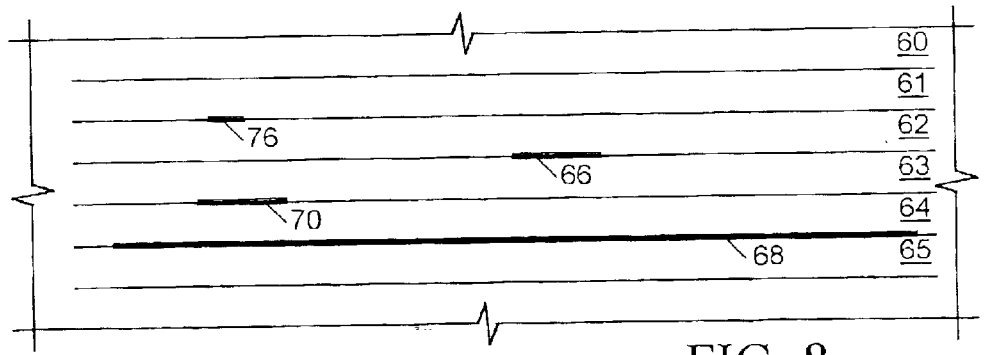

FIG. 5 is a plan view and FIGS. 6–8 are sectional elevation views of a portion of an example IC layout describing an IC as having six signal distribution layers 60–65 with existing power wires 66, 67 and 68 residing on layers 63, 60 and 65, respectively, to which have been added two new power wires 69 and 70 residing on layers 60 and 64, respectively. All power wires 66–70 are a part of the same power distribution network. The portion of the IC layout depicted in FIGS. 5–8 also includes another wire 76 residing on layer 62 which is not a part of the power distribution network.

At step 10, the world HV tree responds to the query by returning data describing the horizontal positions and dimensions of the following intersection boxes:

1. an intersection box 71 at the intersection of new power wire 69 and existing power wire 66,
2. an intersection box 72 at the intersection of new power wire 69 and new power wire 70, and
3. an intersection box 73 at the intersection of new power wire 70 and existing power wire 68.

The layout tool then queries the world HV tree for the position of any existing power wire of the same power distribution network that may touch or overlap (adjoin) any of the intersection boxes found at step 10 (step 12). In the example of FIGS. 5–8, since power wire 67 overlaps box 71, the world HV tree returns a reference to power wire 67.

If the HV tree finds such a power wire (step 14) then the layout tool queries the world HV tree for the position of each intersection box of the power wire found at step 12 (step 16). In the example of FIGS. 5–8, the world V tree returns a reference to the intersection box 74 at the intersection between power wire 67 and power wire 66 at step 16.

The layout tool then returns to step 12 to look for any other existing power wires that may adjoin any intersection boxes previously found at step 10 or 16. In the example of FIGS. 5–8 the global HV tree finds that power wire 68 occupies a horizontal position on layer 65 abutting the horizontal position of intersection box 74. Therefore, during a second pass through step 16, the global HV tree returns data referencing an intersection box 75 at the junction of existing wires 68 and 66.

After the tool determines at step 14 that it has found no more power wires adjoining a previously found intersection box, the layout tool creates a "via" HV tree referencing dimensions and positions within the layout of a separate set of "via boxes" corresponding to each identified intersection box (step 18). Each set of via boxes corresponding to an intersection box relating to two overlapping power wires includes a separate via box residing on each layer between the overlapping wires, and the via HV tree indicates that each via box has the same horizontal position and dimensions as its corresponding intersection box.

Figure 9:
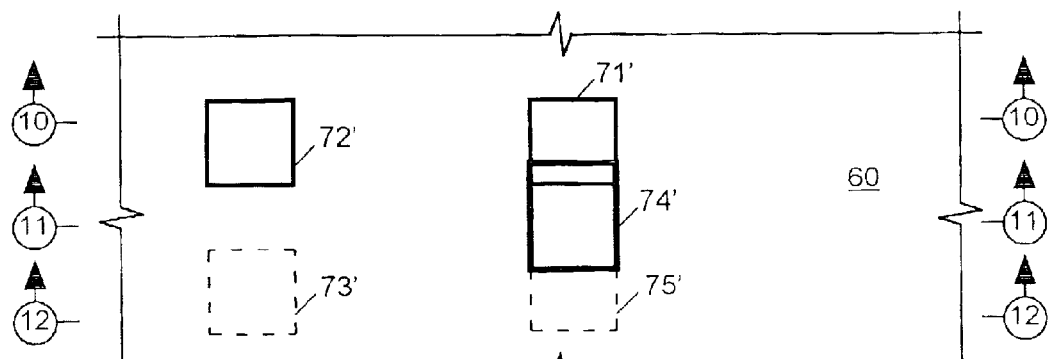
FIG. 9 is a plan view illustrating positions of via boxes within a portion of a signal distribution layer of an IC layout as described by a via HV tree in accordance with the invention.
Figure 10:
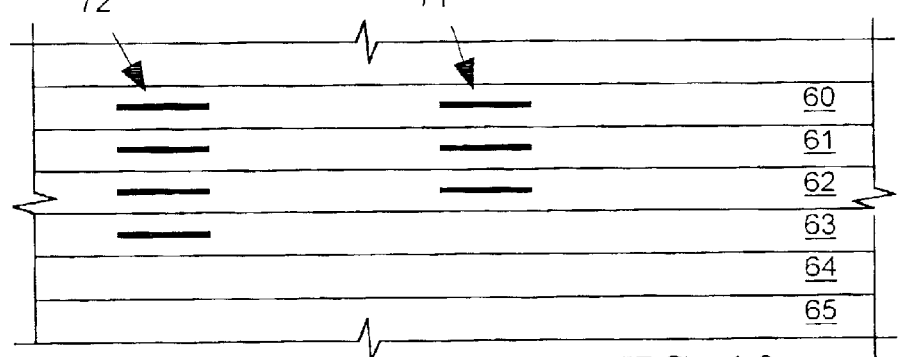
FIGS. 10–12 are sectional elevation views of the IC layout of FIG. 9, FIGS. 13–17 are plan views illustrating positions of via boxes in layers of the layout of FIG. 9.
Figure 11:
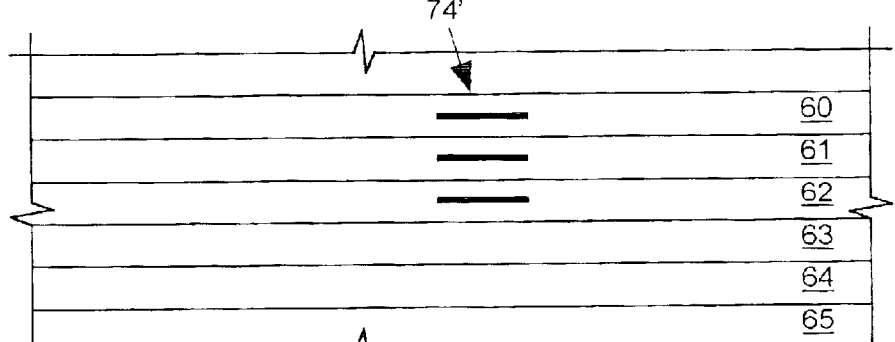
Figure 12:
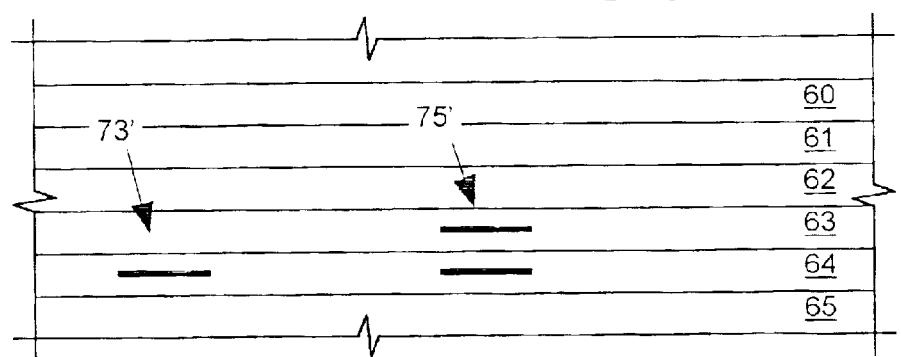

FIG. 9 is a plan view and FIGS. 10–12 are sectional elevation views of the layout described by the via HV tree, including sets of via boxes 71'–75' corresponding to the identified intersection boxes 71–75 of FIG. 5. FIGS. 13–17 are plan views illustrating positions of via box positions on layers 60–64, respectively, as specified by the via HV tree. Each set of via boxes associated with the intersection box representing the overlapping area between two power wires are positioned on the layers through which vias must pass when interconnecting the two power wires. For example, since wire 69 of FIGS. 5 and 6 resides on the upper surface of layer 60 and wire 69 resides just below the lower surface of layer 62, vias extending between power wires 60 and 69 must pass through layers 60–62. Accordingly FIG. 10 shows that the set of via boxes 71' corresponding to the intersection box 71 representing an area of overlap between power wires 66 and 69 of FIG. 5 reside on layers 60–62.

After generating the via HV tree at step 18, the layout tool next (step 20) identifies the via boxes that overlap obstructions that would interfere with vias passing through those cone boxes, and then modifies the via HV tree to convert each obstructed via box into one or more smaller boxes that do not contain obstructions. Such obstructions may include wires and vias not belonging to the same power distribution network.

Step 20 is detailed in the flow chart of FIG. 2. Referring to FIG. 2, the layout tool selects a first via box in the via HV tree (step 22) and then queries the world HV tree for any obstructions that at least partially reside within, on or immediately below the area of the layer covered by the selected via box (step 24). If one or more obstructions are found, then the via HV tree is modified to replace the selected via box with a set of smaller via boxes sized and positioned to occupy all areas of the obstructed via box other than areas occupied by the obstructions (step 26). When there are more via boxes in the via HV tree to process (step 28), a next via box is selected (step 29) and steps 24–28 are repeated. The process of FIG. 2 ends at step 28 after the last via box of the via HV tree has been checked and modified as necessary to clear obstructions.

Figure 18:
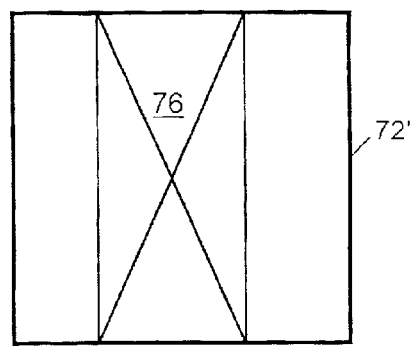
FIG. 18 is a plan view of a via box obstructed by a wire.
Figure 19:
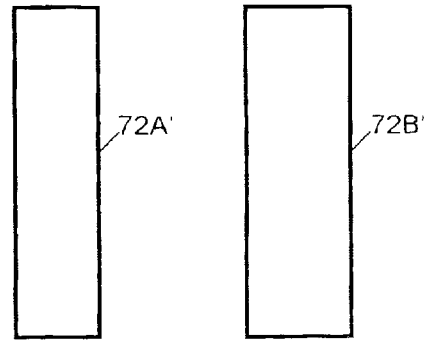
FIG. 19 is a plan view of a pair of via boxes occupying unobstructed areas of the via box of FIG. 18 after the obstructed via box has been partitioned to avoid the obstruction.
Figure 20:
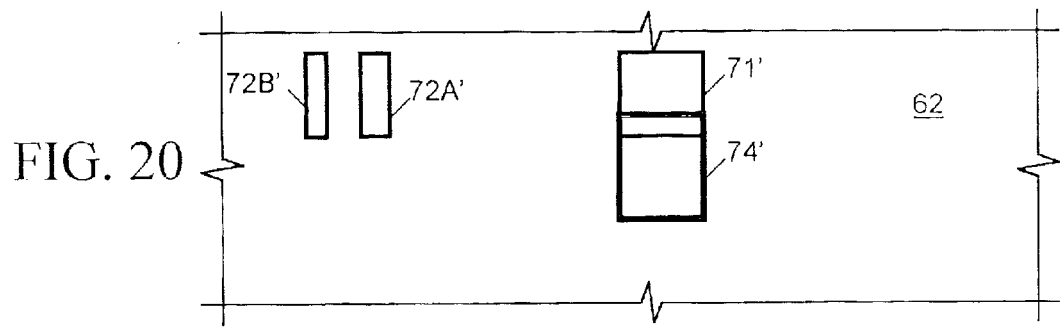
FIG. 20 is a plan view of clone boxes the via HV tree depicts as residing on one IC layer the IC after a clone box has been partitioned to avoid an obstruction as illustrated in FIG. 19, FIGS. 21 and 22 are a plan view of clone boxes depicted by the via HV tree as residing on layers of the IC after adjoining via box have been merged to form a single via box.

For example, as illustrated in FIG. 18, wire 76 of FIGS. 5–8 residing on layers 62 immediately below layer 61 acts as an obstruction to the via boxes 72' residing on layers 61 and 62 (FIG. 10) because wire 76 is not a part of the same power distribution network as the vias that are to pass through via boxes 72' on those two layers. Thus vias passing through the areas defined by via boxes 72' on layers 61 and 62 would improperly contact wire 76. Therefore as shown in FIG. 19, the via HV tree is modified to replace the via box 72' on each of layers 61 and 62 with two via boxes 72A' and 72B' spanning all areas of via box 72' not blocked by the obstruction wire 76. FIG. 20 illustrates, for example, the via box layout of layer 62 as now depicted by the via HV tree.

Referring again to FIG. 1, after modifying the via boxes in the via HV tree at step 20 as necessary to clear obstructions, the layout tool modifies the via HV tree to merge overlapping and abutting boxes to produce larger rectangular boxes (step 30).

Referring to FIG. 3, which details step 30, the layout tool selects a first intersection box in the via HV tree (step 32) and then searches the via HV tree for boxes on the same layer that may abut or overlap the selected box (step 34). The tool then merges the selected box with any adjacent (abutting or overlapping) box found at step 34 having the same width or height and aligned so that the merger produces a larger rectangular box (step 36). When the via HV tree includes other via boxes not yet processed (step 38), a next via box is selected (step 39) and the layout tool repeats steps 34 and 36 where it tries to merge the selected via box with other adjacent via boxes. The merger process ends at step 28 when all via boxes that can be merged have been merged.

Figure 21:
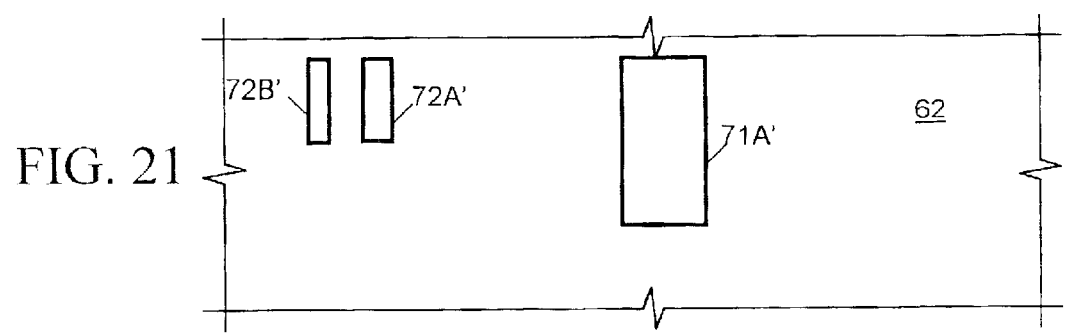
Figure 22:
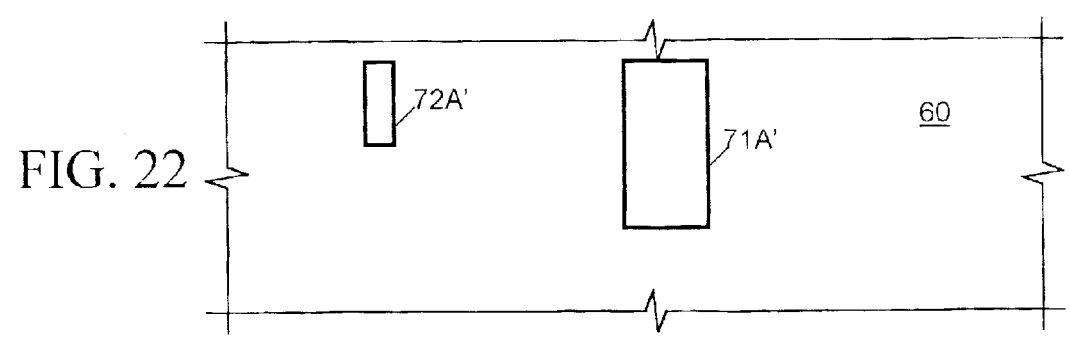

As see in FIG. 20, the via boxes 71' and 74' on layer 62 overlap, have the same width and are aligned in a way that allows them to be merged at step 36 into a single via box 71A' as illustrated in FIG. 21. As may be seen in FIGS. 13 and 14, the via boxes 71' and 74' residing on layers 60 and 61 can be similarly merged. FIG. 22 shows how the via HV tree depicts the contents of layer 60 following the merger of via boxes 71' and 74'. The via HV tree depiction of layer 61 would be similar to that shown in FIG. 21 for layer 62.

Figure 23:
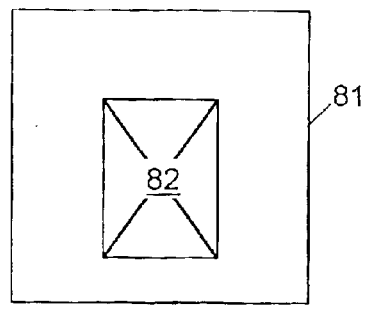
FIG. 23 is a plan view of a via box containing an obstruction.
Figure 24:
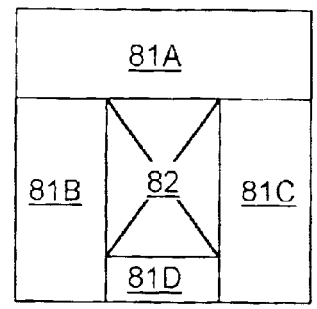
FIG. 24 is a plan view of a set of via boxes occupying unobstructed areas of the via box of FIG. 24 after the obstructed via box has been partitioned to avoid the obstruction.

FIGS. 23 and 24 illustrate how the tool would divide a via box 81 spanning an obstruction 82 (FIG. 23) into a set of four smaller via boxes 81A–81D (FIG. 24) filling all areas of via box 81 not occupied by obstruction 82.

Referring again to FIG. 1, after merger step 30, the layout tool modifies the via HV tree to divide via boxes that overlap larger via boxes into smaller via boxes (step 40). FIG. 4 details step 40. Referring to FIG. 4, the layout tool selects the via box having the largest area (step 42) and then searches the via HV tree for other via boxes on the same layer as the selected via box that adjoin (touch or overlap) the selected box (step 44). If such adjoining via boxes are found at step 46, the layout tool divides the adjoining boxes into smaller via boxes along cut lines extending along the edges of the selected via box so that some of the resulting smaller via boxes will have the same height or width as the selected box (step 46). If the via HV tree includes more via boxes to process in this manner (step 48), the layout tool selects the next largest via box (step 50) and repeats steps 44, 46 and 48. The process of FIG. 4 ends at step 48 when all via boxes adjoining larger via boxes have been processed and partitioned.

Figure 25:
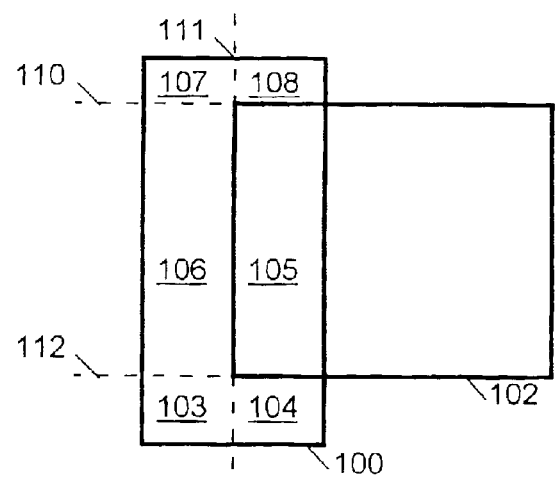
FIG. 25 is a plan view of a pair of overlapping via boxes illustrating how the smaller of the two via boxes is to be subdivided into a set of smaller via boxes prior to a merge operation.

For example FIG. 25 illustrates how the layout tool would (at step 46) partition a small via box 100 intersecting a larger via box 102 into several via boxes 103–108 along cut lines 110–112 extending along edges of box 102.

Figure 26:
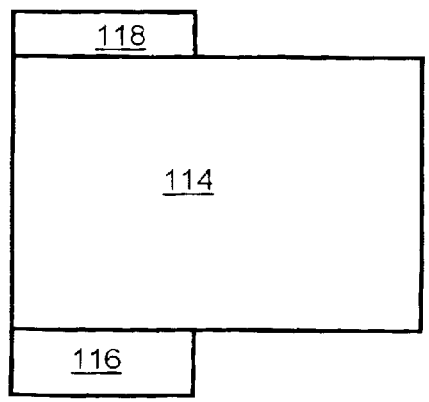
FIG. 26 is a plan view of via boxes illustrating how partitioned via boxes of FIG. 25 of are merged to form larger via boxes.
Figure 27:
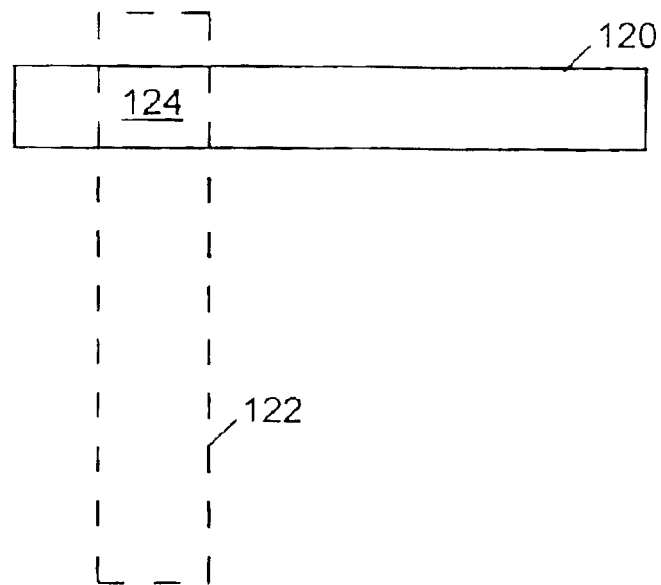
FIGS. 27 and 28 are plan views of overlapping power wires in an IC layout.
Figure 28:
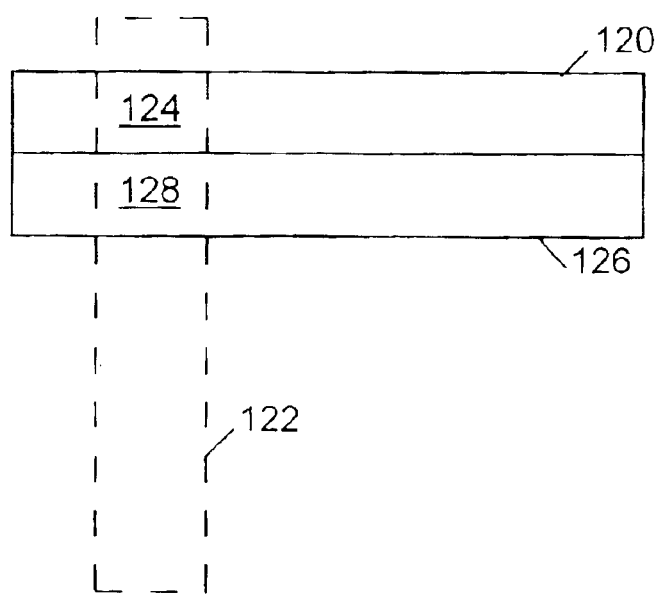

Referring again to FIG. 1, the layout tool now repeats the process of FIG. 2 (step 52) to merge, where possible, smaller boxes created at step 40 with their larger neighbors. For example FIG. 26 illustrates how the smaller via boxes of FIG. 25 are merged to form larger via boxes. Via boxes 102, 105 and 106 merge to form a larger via box 114, via boxes 103 and 104 merge to form via box 116, and via boxes 107 and 108 merge to form via box 111.

Thereafter (step 54) the layout tool modifies the IC layout to provide vias in the areas of the layers occupied by via boxes as indicated by the via HV tree, with the vias being designed to make the most efficient use of the space defined by the via boxes. Any pre-existing power wire vias in the areas occupied by the via boxes are replaced when the tool modifies the layout to add the vias in those areas. The layout tool also updates the world HV tree at step 54 to add the new vias. By merging small via boxes into larger via boxes, the method helps to maximize the current carrying capacity of vias the layout tool designs to interconnect power wires. A conventional layout tool can usually design a large via structure (filling a large area) that is capable of handling more current than several smaller via structures it might design to fill several small adjacent areas spanning the same total area as the larger via.

The foregoing specification and the drawings depict exemplary embodiments of the best mode of practicing the invention, and elements or steps of the depicted best mode exemplify the elements or steps of the invention as recited in the appended claims. However the appended claims are intended to apply to any mode of practicing the invention comprising the combination of elements or steps as described in any one of the claims, including elements or steps that are functional equivalents of the example elements or steps of the exemplary embodiment(s) of the invention depicted in the specification and drawings.

What is claimed is:

1. For an integrated circuit (IC) layout describing an IC as having a plurality of vertically stacked layers and as having a plurality of objects, each occupying space within the layers, wherein some of the objects are power wires and vias forming a power distribution network, a method of modifying the layout to add at least one new power wire to the power distribution network and to add new vias connecting the new power wire to existing power wires of the power distribution network, the method comprising steps of:

a. providing a global HV tree referencing each layer of the IC and indicating a space on each layer occupied by each of the objects residing on that layer;
   b. providing a via HV tree referencing each layer of the IC;
   c. modifying the layout so that it also describes the IC as also including the new power wire residing on one layer of the plurality of layers;
   d. updating the global HV tree so that it also indicates a space the new power wire occupies on said one layer; and
   e. querying the global HV tree to establish horizontal dimensions and position of a separate intersection box corresponding to each area of vertical overlap between the new power wire and any one of said power wires of the power distribution network, each intersection box having horizontal dimensions and position similar to its corresponding area of vertical overlap.

2. The method in accordance with claim 1 further comprising the step of:

f. querying the global HV tree to successively establish horizontal dimensions and position of an additional intersection box corresponding to each area of vertical overlap between existing power wires wherein the additional intersection box also vertically overlaps or abuts any previously established intersection box.

3. The method in accordance with claim 2 further comprising the step of:

g. for each intersection box established at steps e and f, adding references in the via HV tree to a corresponding plurality of via boxes, wherein each via box of the plurality of via boxes corresponding to each intersection box occupies a space on a separate layer of horizontal dimensions and position similar to those of the corresponding intersection box, wherein the plurality of via boxes corresponding to each intersection box occupy the layers residing between power wires whose area of overlap defined the horizontal dimensions and position of the corresponding intersection box.

4. The method in accordance with claim 3 further comprising the step of:

h. querying the global HV tree to locate obstructions, wherein an obstruction is one of said objects described by the global HV tree as residing in the layers, as being other than a part of the power distribution network, and as occupies any area of any layer also depicted by the via HV tree as being occupied by any one of the via boxes.

5. The method in accordance with claim 4 further comprising the step of:

i. modifying the via HV tree to replace each via box occupying an area also occupied by an obstruction by at least one smaller via box occupying all areas of the via box being replaced not also occupied by the obstruction.

6. The method in accordance with claim 5 further comprising the step of:

j. modifying the via HV tree to merge adjacent via boxes to create larger via boxes.

7. The method in accordance with claim 3 further comprising the step of:

h. modifying the layout to provide vias through areas of the layers the via HV tree specifies as being occupied by via boxes.

8. The method in accordance with claim 4 further comprising the step of:

i. modifying the layout to provide vias through areas of the layers the via HV tree specifies as being occupied by via boxes.

9. The method in accordance with claim 5 further comprising the step of:

j. modifying the layout to provide vias through areas of the layers the via HV tree specifies as being occupied by via boxes.

10. The method in accordance with claim 6 further comprising the step of:

k. modifying the layout to provide vias through areas of the layers the via HV tree specifies as being occupied by via boxes.

11. Computer readable media containing software which when read and executed by a computer, causes the computer to carry out a method of modifying an integrated circuit (IC) layout describing an IC as having a plurality of vertically stacked layers and as having a plurality of objects, each occupying space within the layers, wherein some of the objects are power wires and vias forming a power distribution network, wherein the method modifies the layout to add at least one new power wire to the power distribution network and to add new vias connecting the new power wire to existing power wires of the power distribution network, wherein the method comprises steps of:

a. providing a global HV tree referencing each layer of the IC and indicating a space on each layer occupied by each of the objects residing on that layer;
    b. providing a via HV tree referencing each layer of the IC;
    c. modifying the layout so that it also describes the IC as also including the new power wire residing on one layer of the plurality of layers;
    d. updating the global HV tree so that it also indicates a space the new power wire occupies on said one layer; and e. querying the global HV tree to establish horizontal dimensions and position of a separate intersection box corresponding to each area of vertical overlap between the new power wire and any one of said power wires of the power distribution network, each intersection box having horizontal dimensions and position similar to its corresponding area of vertical overlap.

12. The computer readable media in accordance with claim 11 wherein the method further comprises the step of:

f. querying the global HV tree to successively establish horizontal dimensions and position of an additional intersection box corresponding to each area of vertical overlap between existing power wires wherein the additional intersection box also vertically overlaps or abuts any previously established intersection box.

13. The computer readable media in accordance with claim 12 wherein the method further comprises the step of:

g. for each intersection box established at steps e and f, adding references in the via HV tree to a corresponding plurality of via boxes, wherein each via box of the plurality of via boxes corresponding to each intersection box occupies a space on a separate layer of horizontal dimensions and position similar to those of the corresponding intersection box, wherein the plurality of via boxes corresponding to each intersection box occupy the layers residing between power wires whose area of overlap defined the horizontal dimensions and position of the corresponding intersection box.

14. The computer readable media in accordance with claim 13 wherein the method further comprises the step of:

h. querying the global HV tree to locate obstructions, wherein an obstruction is one of said objects described by the global HV tree as residing in the layers, as being other than a part of the power distribution network, and as occupies any area of any layer also depicted by the via HV tree as being occupied by any one of the via boxes.

15. The computer readable media in accordance with claim 14 wherein the method further comprises the step of:

i. modifying the via HV tree to replace each via box occupying an area also occupied by an obstruction by at least one smaller via box occupying all areas of the via box being replaced not also occupied by the obstruction.

16. The computer readable media in accordance with claim 15 wherein the method further comprises the step of:

j. modifying the via HV tree to merge adjacent via boxes to create larger via boxes.

17. The computer readable media in accordance with claim 13 wherein the method further comprises the step of:

h. modifying the layout to provide vias through areas of the layers the via HV tree specifies as being occupied by via boxes.

18. The computer readable media in accordance with claim 14 wherein the method further comprises the step of:

i. modifying the layout to provide vias through areas of the layers the via HV tree specifies as being occupied by via boxes.

19. The computer readable media in accordance with claim 15 wherein the method further comprises the step of:

j. modifying the layout to provide vias through areas of the layers the via HV tree specifies as being occupied by via boxes.

20. The computer readable media in accordance with claim 16 wherein the method further comprises the step of:

k. modifying the layout to provide vias through areas of the layers the via HV tree specifies as being occupied by via boxes.

* * * * *